United States Patent [11] 3,612,964

[72] Inventor Satoru Kawazu
Itami, Japan

[21] Appl. No. 213
[22] Filed Jan. 2, 1970
[45] Patented Oct. 12, 1971
[73] Assignee Mitsubishi Denki Kabushiki Kaisha
Tokyo, Japan
[32] Priority Jan. 6, 1969, May 9, 1969
[33] Japan
[31] 44/1249 and 44/35611

[54] MIS-TYPE VARIABLE CAPACITANCE SEMICONDUCTOR DEVICE
8 Claims, 12 Drawing Figs.

[52] U.S. Cl. .......... 317/235, 317/234
[51] Int. Cl. .......... H01l 11/14
[50] Field of Search .......... 317/234, 235

[56] References Cited

UNITED STATES PATENTS

| | | | |
|---|---|---|---|
| 2,964,648 | 12/1960 | Daucette et al. | 317/235 X |
| 2,989,650 | 6/1961 | Daucette et al. | 317/235 X |
| 3,097,308 | 7/1963 | Wallmark | 317/235 X |
| 3,528,064 | 9/1970 | Everhart et al. | 317/235 X |
| 3,535,600 | 10/1970 | Engeler | 317/235 |

*Primary Examiner*—James D. Kallam
*Attorneys*—Robert E. Burns and Emmanuel J. Lobato

ABSTRACT: A comb-shaped P-type region is provided on one main face of an N-type substrate to form therebetween a P–N junction terminating at that face. An insulating film is disposed on both the one face of the substrate and the P-region, except for a predetermined portion of the P-region, and a metallic layer is disposed on the film to extend over the P–N junction. A DC voltage across the substrate and P-region is controlled to change the capacitance between the substrate and film of the resulting MIS-type structure.

FIG. 6
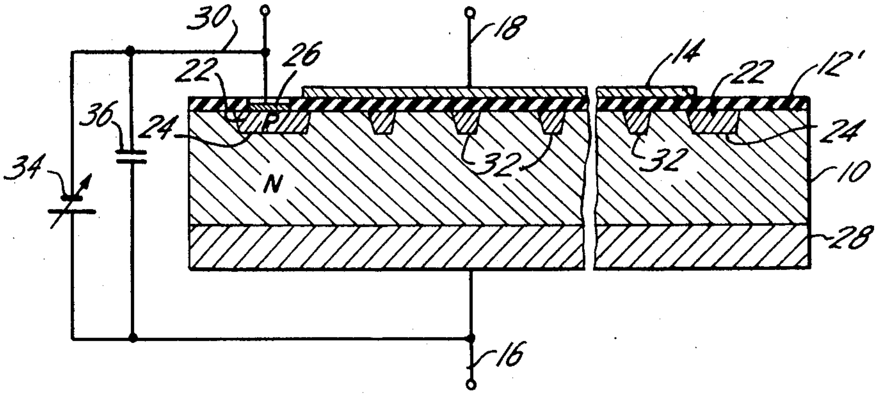
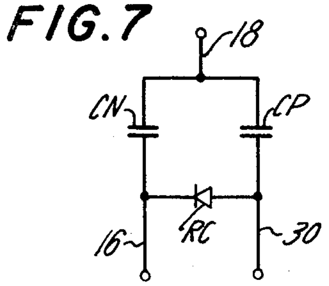
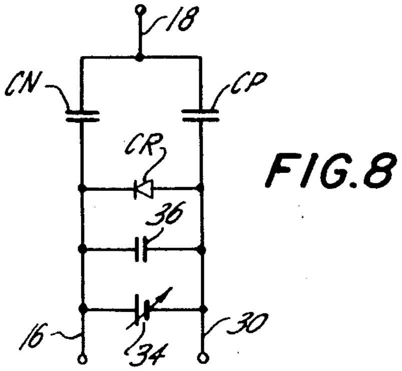
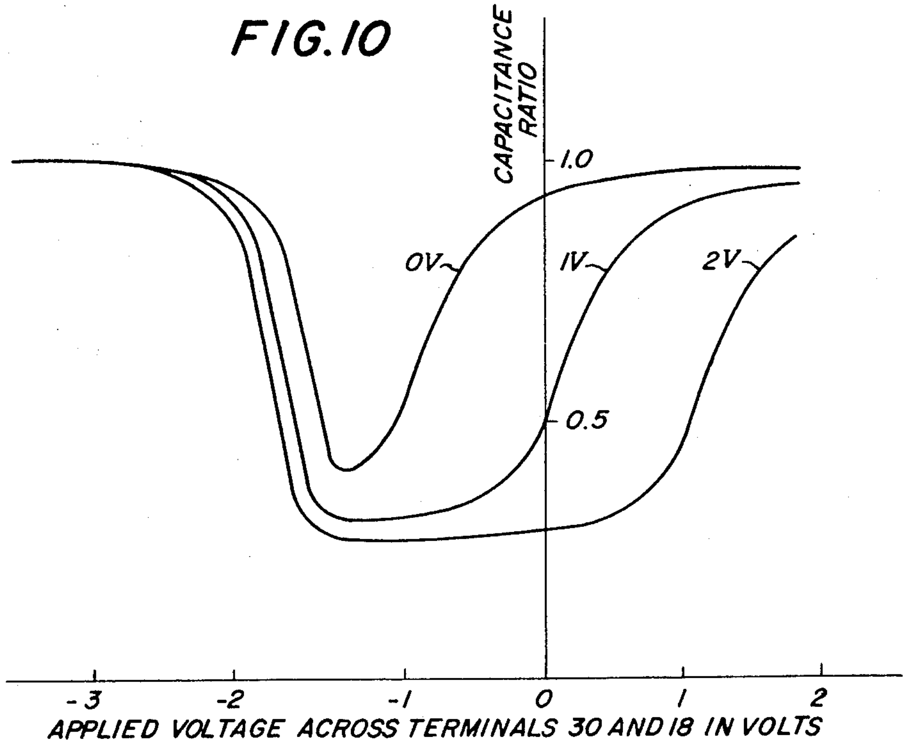

FIG. 9
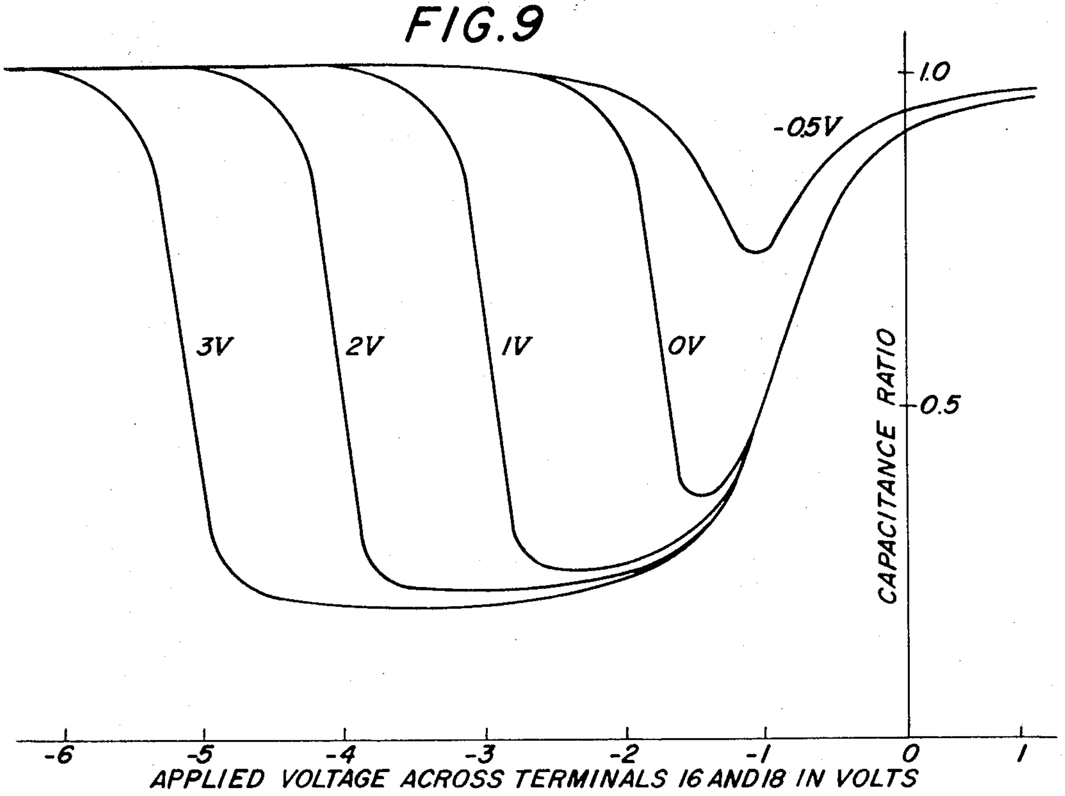
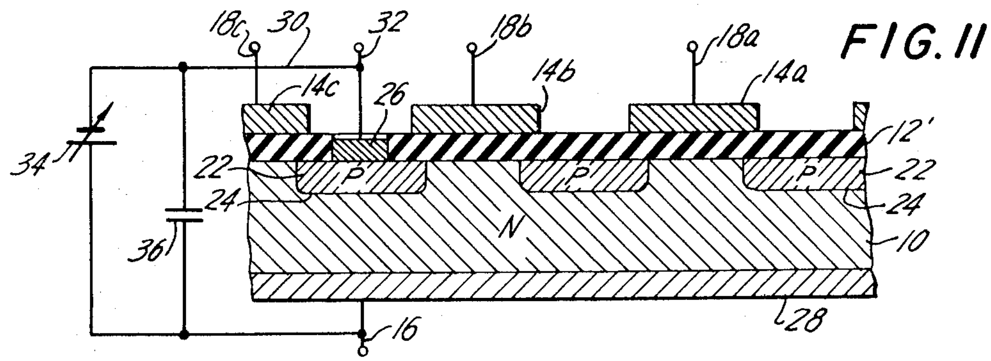
FIG. 12
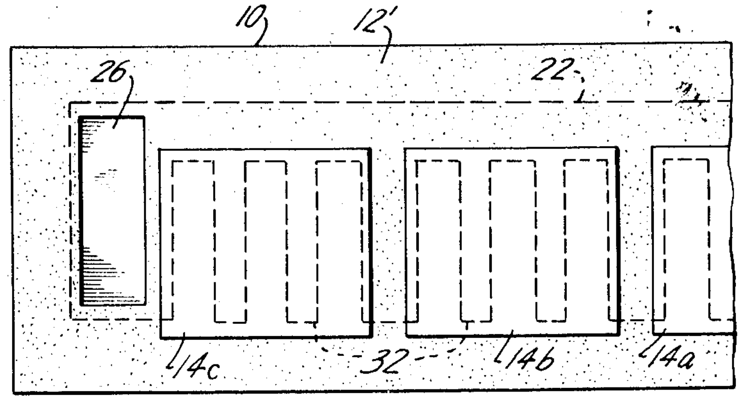

MIS-TYPE VARIABLE CAPACITANCE SEMICONDUCTOR DEVICE

BACKGROUND OF THE INVENTION

This invention relates to improvements in metal-insulator-semiconductor MIS-type variable capacitance semiconductor devices.

The conventional type of variable capacitance semiconductor device of MIS structure has comprised an insulating layer disposed on one of opposed main faces of a substrate of semiconductive material, having for example an N-type conductivity, and a metallic film or electrode disposed on the insulating layer. When a DC voltage is applied to such a conventional MIS-type variable capacitance semiconductor device, with the substrate connected to ground and the metallic electrode changed in magnitude from a positive to a negative direction, the capacitance measured between the substrate and the metallic electrode gradually decreases from a certain magnitude and then increases under low frequency conditions. However, under high frequency conditions divided from the low frequency conditions by a frequency ranging from a few Hz. to 10 Hz., the measured capacitance gradually decreases over a range similar to that exhibited under the low frequency conditions but thereafter it does not increase. These phenomena are shown, for example, in FIGS. 9 and 10, on page 275 of A. S. Grove book entitled "Physics and Technology of Semiconductor Devices" published in 1967 by John Wiley and Sons, Inc., New York, London, Sidney. The cited FIGS. 9, 10 illustrate that at a frequency of about $10^2$ Hz., the MIS structure has the capacitance-voltage characteristics approaching the high frequency characteristics apart from the low frequency characteristics. In other words, the MIS structure has a variable capacitance which is frequency-dependent at such lower frequencies. Thus the conventional MIS-type variable capacitance semiconductor devices have been practically utilized only within a range of capacitances which are independent of frequency.

Efforts have also been made to render the capacitance of the MIS structure frequency-independent, even at frequencies higher than that above described. As a result, there has been proposed an improved MIS structure wherein a substrate of semiconductive material, having, for example, a N-type conductivity, has disposed thereon a semiconductive region of opposite or P-type conductivity with an insulating film and a metallic electrode disposed in the similar manner as above described. If a voltage applied across the N-type substrate is shortcircuited to the P-type region and the metallic electrode is changed as in the first-mentioned devices, the measured capacitance between the substrate and the metallic electrode has been variable up to the order of at most 1 kHz. independent of the applied frequencies, and with a comparatively small maximum magnitude. For example, the A. S. Grove et al. article entitled "Surface Effects on P–N Junctions: Characteristics of Surface Space-Charge Regions under Nonequilibrium Conditions," Solid-State Electronics, Vol. 9, pages 783–809 (1966) shows in FIG. 15 on page 799 that with a gate or metallic electrode extended 40 mils over the substrate, the capacitance began to be frequency dependent in the order of 10 kHz. That citation also illustrates in FIG. 13 on page 797 the results of measurements conducted at a frequency of 100 kHz. with a gate extended 5 mils over the substrate as well as those obtained with a P–N junction between the N-type substrate and the P-type region shortcircuited corresponding to $V_f=0$, and with other cases.

Thus, conventional MIS-type variable capacitance semiconductor devices have frequency-dependent capacitance-to-voltage characteristics above, at most, 100 kHz., and therefore their applications to radio communication equipments such as radio transmitters and receivers have been subject to some limitations. Consequently, the concept has been heretofore prevalent that such semiconductor devices are difficult to be used for general purposes and therefore they have been scarcely taken into consideration up to now.

SUMMARY OF THE INVENTION

Accordingly it is a general object of the invention to provide a new and improved MIS-type variable capacitance semiconductor device having a variable capacitance independent upon a frequency applied thereto in a frequency band extended up to a relatively high frequency.

It is another object of the invention to provide a new and improved MIS-type variable capacitance semiconductor device having a variable capacitance independent upon a frequency applied thereto in the VHF band, for example in the order of from 50 to 100 MHz.

It is still another object of the invention to provide a new and improved MIS-type variable capacitance semiconductor device which varies in capacitance independent of applied frequencies up to very high frequencies, and having such characteristics that with a DC voltage applied across a substrate and metallic electrode thereof and varied in magnitude in a predetermined direction, a capacitance therebetween increases and decrease thereby to permit the device to be selectively used in positive and negative feedback circuits.

It is a further object of the invention to provide a new and improved MIS-type variable capacitance semiconductor device capable of changing capacitances between a plurality of terminals attached to the device, in response to a single control signal, for the purpose of changing capacitive values of variable capacitance elements disposed in different portions of a circuit by the adjustment of the single control signal.

It is still another object of the invention to provide means for changing capacitances between a plurality of terminals attached to the device, but having applied thereto no voltage, but adjusting a single source of control signals.

The invention accomplishes the above-cited object by the provision of an MIS-type variable capacitance semiconductor device comprising a first region of semiconductive material having one type conductivity and including a pair of substantially flat opposed main faces, a second comb-shaped region of opposite type conductivity disposed on one of the main faces of the first region to form therebetween a P–N junction terminating at the one main face, a film of electrically insulating material disposed on both the one main face of the first region and the surface of the second region, except for a predetermined portion of the second region, a metallic layer disposed on the insulating film to extend over the P–N junction, and a pair of metallic electrodes attached to the predetermined portion of the second region and the opposite main face of the first region respectively. The device is so constructed that the application of a voltage across the first region and said metallic layer forms an inversion layer on the one main face of the first region into which the majority carriers for the inversion layer are injected through the second region.

Preferably, the metallic layer is disposed over a plurality of the teeth of the comb shaped region, being separated therefrom by the insulating film.

The metallic layer may be advantageously divided into plural portions electrically isolated from one another and covering different groups of the comb's teeth through the insulating film.

BRIEF DESCRIPTION OF THE DRAWINGS

The invention will become more readily apparent from the following detailed description taken in conjunction with the accompanying drawings in which:

FIG. 6 is a sectional view taken along the line VI—VI of FIG. 5 and also illustrating with parts cut away, an electrical connection for the device P;

FIG. 7 is a wiring diagram illustrating an equivalent circuit to the device such as shown in FIG. 4;

FIG. 8 is a wiring diagram illustrating an equivalent circuit to the device shown in FIGS. 5 and 6;

FIG. 9 is a graph representing the capacitance-to-voltage voltage characteristics of the device shown in FIGS. 5 and 6;

FIG. 10 is a graph similar to that shown in FIG. 9, but in which one of two terminals across which a DC voltage is applied is different from those used for the graph in FIG. 9;

FIG. 11 is a fragmental sectional view illustrating a modification of the invention along with an electrical connection therefor; and FIG. 12 is a fragmental plan view of a device embodying the principles of the invention illustrated in FIG. 11.

DESCRIPTION OF THE PREFERRED EMBODIMENTS

Figure 1:
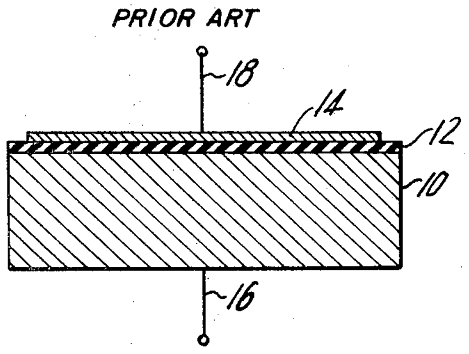
FIG. 1 PRIOR ART
FIG. 1 is a schematic sectional view of an MIS-type variable capacitance semiconductor device constructed in accordance with the principles of the prior art.

Referring now to the drawings and FIG. 1 in particular, it is seen that an arrangement disclosed therein comprises a substrate 10 of any suitable semiconductive material of one type conductivity such as N-type silicon or germanium including an N-type impurity, as for example, phosphor, arsenic, a III–V compound, or a II–VI compound and an insulating film 12 disposed on one of the opposed main faces of the substrate 10. The insulating film 12 may be of any suitable electrical insulating material and is preferably formed of silicon dioxide, silicon nitride or the like. Disposed on the insulating film 12 is an electrode or a layer 14 of any suitable metal such as aluminum or the like. Then a pair of electric conductors 16 and 18 are electrically connected to the other face of the substrate 10 and the metallic electrode 16 respectively.

Figure 2:
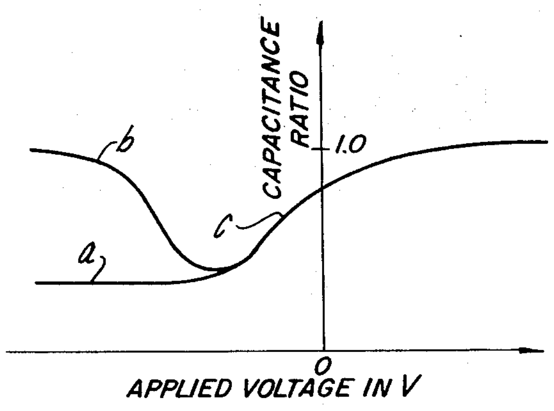
FIG. 2 is a graph illustrating the capacitance-to-voltage characteristics of the device shown in FIG. 1.

If, with the conductor 16 connected to ground, a DC voltage is applied across the conductors 16 and 18 and varied in magnitude then a capacitance between the metallic electrode 14 and that face remote from the electrode of the substrate 10 varies as shown in FIG. 2 wherein the axis of abscissas represents the voltage applied across the conductors 16 and 18 and the axis of ordinates represents the relative magnitude of the capacitance, assuming that a maximum magnitude of the capacitance between the conductors 16 and 18 is equal to one.

In order to measure the capacitance as above described, the DC voltage may be applied across the conductors 16 and 18 through an inductance (not shown) connected to the conductor 18, with the capacitance serially connected to a blocking capacitor of known magnitude (not shown), so that the capacitance is measured in an alternating current manner as well known in the art.

In FIG. 2, curve *a* illustrates the capacitance-to-voltage characteristics under the high frequency conditions. However, under low frequency conditions, divided from the high frequency condition by a frequency ranging from a few hertz or 10 hertz, such characteristics change as shown at curve *b* in FIG. 2. Therefore, in order to utilize the semiconductor device of FIG. 1 for practical purposes, it should be operated within a voltage range wherein the capacitance varies independently of a frequency involved, that is to say, on that curve portion on which the curve *a* overlaps the curve *b* as shown at curve portion *c* in FIG. 2.

As previously described, the capacitance-to-voltage characteristic of semiconductor devices such as shown in FIG. 1 has been also frequency dependent at higher frequencies, and there have been made various efforts to increase that frequency below which a change in capacitance does not depend upon a frequency. These efforts have resulted in the development of MIS-type variable capacitance semiconductor devices such as shown in FIGS. 3 and 4, wherein like reference numerals designate the components identical or corresponding to those illustrated in FIG. 1.

Figure 3:
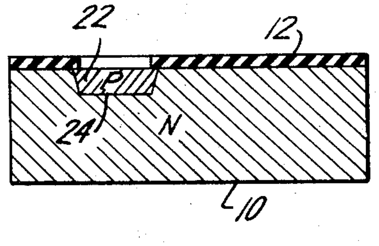
FIG. 3 PRIOR ART
FIG. 3 is a schematic sectional view of another MIS-type variable capacitance semiconductor device of the conventional structure shown in a certain step of the manufacturing process.
Figure 4:
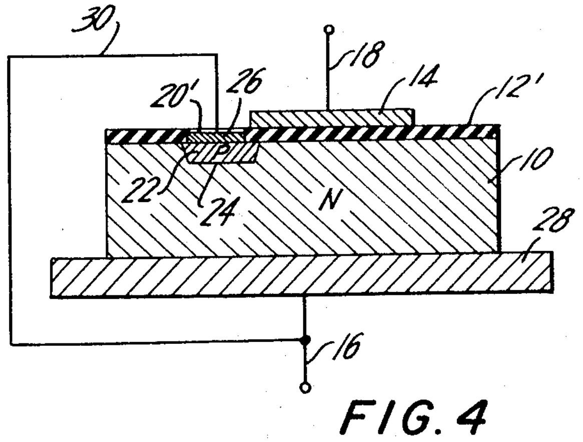
FIG. 4 is a view similar to FIG. 3 but illustrating the device of FIG. 3 after having been completed.

In FIG. 3, wherein the device is illustrated in a certain step of the manufacturing process, the substrate 10 is composed, for example, of N-type silicon and includes a pair of opposite main faces which are chemically polished to be substantially flat and cleaned. A film 12 of silicon dioxide is formed on one of the main faces, in this case the upper face as viewed in FIG. 3, of the substrate 10 as by heating the substrate in an electric furnace having an oxidizing atmosphere. If desired, the film 12 may be of any suitable electrical insulating material other than silicon oxide. Then the well-known photolithographic and chemical etching process are used to form an opening 20 in any desired shape on a predetermined portion of the insulating film 12. Thereafter a P-type impurity for example boron is diffused into a predetermined surface portion of the substrate 10, through the opening 20, to provide a P-type region 22 therein with a P–N junction 24 formed between the P-type region 22 and the N-type substrate or region 10.

After the formation of the P-type region 22 in the substrate 10, the entire film 12 of silicon dioxide is removed from the substrate 10 by any suitable means and then the substrate 10 is again heated in an oxidizing atmosphere to dispose a clean insulating film 12′ of silicon dioxide (see FIG. 4) only on the upper face of the substrate 10. The process of forming the opening 20 on the insulating film 12 is repeated to form an opening 20′ at the same position as the previous opening 20, that is to say, on those portions located directly above the P-type region 22 of the insulating film 12′. Then any suitable metallic material such as aluminum is vacuum deposited on the surface of the insulating film 12′ including the opening 20′, and subsequently the undesired portion of the deposited aluminum layer is removed by the photolithographic and chemical etching processes known in the art to form a metallic electrode 26 in the opening 20′ and a metallic electrode or layer 14 in a predetermined area of the surface of the insulating film 12′. It is noted that the metallic layer 14 extends over at least one portion of the P–N junction 24, and is separated therefrom by the insulating film 12′. In this way, a variable capacitance semiconductor element of the so-called MIS-type has been composed of the metallic layer 14, the insulating film 12′ of silicon oxide and the semiconductive region 10.

Then a base plate 28 of any suitable electrical insulating material approximating in coefficient of thermal expansion the semiconductive material for the substrate 10, for example, Kovar (trademark), molybdenum or the like, is disposed in ohmic contact with that face remote from the insulating film 12′ of the substrate 10. Such disposal may be conveniently accomplished as by highly doping the face to be contacted with an N-type impurity and applying a layer of solder such as gold to that surface of the plate 28 to be contacted. In order to complete the MIS-type variable capacitance semiconductor device, electric conductors 16, 18 and 30 are attached to the base plate 28, the metallic layer 14 and the electrode 26, respectively, with the conductor 16 connected to the conductor 30, for short circuiting the P-type region 22 to the N-type substrate 10. For the same purpose that face of the substrate 10 which is remote from the base plate 28 may be highly doped with an N-type impurity to form an $N^+$-type region serving to short circuit the P-type region 22 to the substrate, or region 10, although the $N^+$-type region is not illustrated.

The arrangement as shown in FIG. 4 is found to have the critical frequency of, at most, 100 kHz., under which its capacitance-to-voltage characteristics follow the curve *b* as shown in FIG. 2 and above which the characteristics are represented by the curve *a* as shown in the same figure. Thus it has been concluded that MIS-type variable capacitance semiconductor devices having the structure as shown in FIG. 4 are deficient for use in a variety of radio communication equipments. Up to date, therefore, such semiconductor devices have been kept from the expert's eyes.

The invention contemplates to increase the critical frequency just described to a higher value, and particularly to from 50 to 100 MHz.

Figure 5:
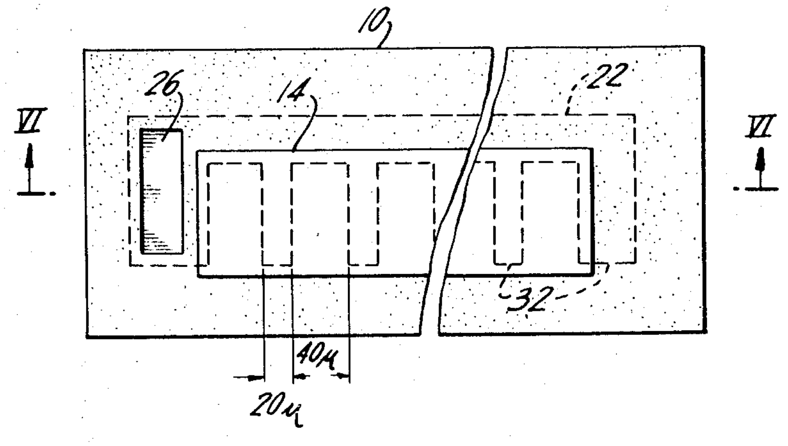
FIG. 5 is a plan view with parts broken away, showing an MIS-type variable capacitance semiconductor device constructed in accordance with the principles of the invention.

FIGS. 5 and 6 illustrate an MIS-type variable capacitance semiconductor device constructed in accordance with the principles of the invention. The arrangement illustrated is similar to that shown in FIG. 4 except for the configuration of the P-type region 22. Therefore like reference numerals have been employed to identify the components identical to, or corresponding to those illustrated in FIG. 4, and only the differences therebetween will now be described. Also, it will be readily understood that due to the simplicity of the structure, the arrangement shown in FIGS. 5 and 6 may be constructed in a manner similar to that described above in conjunction with FIGS. 3 and 4.

As best shown in FIG. 5, the P-type region 22 is in the form of a comb including a relatively large number of teeth 32, for example, several tens of teeth. The control electrode 26 for the P-type region 22 is shown in FIGS. 5 and 6 as being attached to the leftmost tooth 32 as viewed FIG. 5 of the comb, which tooth is particularly larger in width than the remaining teeth. If desired, the control electrode may be attached to a selected one of the combs teeth 32. Alternatively, a plurality of such electrodes may be attached to selected ones of the teeth with satisfactory results.

Preferably both the end teeth 32 of the comb may be larger in width than the intermediate teeth. The comb is shown in FIG. 5 as including the intermediate teeth substantially equal in width *e* to one another and having a common spacing *d* therebetween. If desired, the comb may include teeth which are different in width and/or spacing from one another. It has been found that, the smaller the spacing *d* between the teeth 32, the higher will be the maximum frequency under which the device can be effectively operated.

The metallic layer or electrode 14 is disposed on the insulating film 12′ disposed on the entire main face of the substrate 10, except for that portion thereof having disposed thereon the control electrode 26. The electrode 14 overlaps the substantial portion of the P–N junction 24 formed between the N-type substrate 10 and the comb-shaped P-type region 22, and is preferably extended over all the intermediate teeth portion 32 of the P-type region 22.

The arrangement as shown in FIGS. 5 and 6 has been found to exhibit capacitance-to-voltage characteristics following the curve *b* rather than the curve *a* shown in FIG. 2, even under high frequency conditions. That is when a DC voltage is applied across the electrodes 16 and 18, such that the electrode 18 is negative with respect to the grounded electrode 16, thereby inverting the surface conductivity type of the N-type substrate or region 10, the resulting capacitance-to-voltage characteristics follow the curve *b* of FIG. 2 provided that the number of the majority carriers in the inversion layer increases or decreases in accordance with a measurement frequency. Otherwise such characteristics follow the curve *a* as shown in FIG. 2.

In the conventional arrangement as shown in FIG. 4, the majority carriers, so designated with respect to the inversion layer, in this case, the holes, are injected from the P-type region 22 into the inversion layer to permit their number to somewhat follow the higher measurement frequency. However the greater the distance between that portion of the inversion layer formed on the surface of the N-type region 10 below the metallic layer 14 and the associated P–N junction 24, the less the number of the majority carriers injected from the P-type region 22 into the inversion layer will follow the measurement frequency. As a result, a maximum frequency to which the number of the injected majority carriers follows has been in the order of at most 100 kHz.

In order to increase that maximum frequency, the P-type region 22, according to the invention, takes the form of a comb as best shown in FIG. 5, while the spacing between the comb's teeth 32 is made narrow to cause the width of the inversion layer in the N-type region 10, between each pair of adjacent comp's teeth 32, 32; to be made as small as possible. This measure permits the number of the majority carriers injected from the P-type region 22 into the inversion layer to readily follow the frequencies including the very high frequencies (VHF).

FIG. 6 shows also a variable control source 34 of direct current connected across the conductors 16 and 30 and having a capacitor 36 connected thereacross for the purpose described hereinafter.

With the N-type region 10 short circuited to the P-type region 22 by rendering the voltage across the source 34 equal to 0 volts, the majority carriers or holes can be also injected from the P-type region 22 into the inversion layer formed on the surface of the N-type region or substrate 10. Under these circumstances, the application of a highly negative voltage to the metallic layer 14 permits the majority carriers to be injected from the P-type region into the inversion layer in response to that negative voltage, even in the case where a reverse voltage below a predetermined magnitude is applied across the N- and P-type regions 10 and 22, respectively. In other words, as long as the P-type region 22 is not less in potential that the inversion layer, the majority carriers can be injected from the P-type region 22 into the inversion layer.

As an example, semiconductor devices such as shown in FIGS. 5 and 6, were produced, including the N-type silicon substrate 10, having a resistivity of 25 ohm-centimeters, and the P-type region 22 in the form of a comb including 40 teeth 32 each having a width *e* of 20 microns and spaced away from each other by a spacing *d* of 40 microns as designated in FIG. 5.

With the substrate connected to ground, the potential on the metallic layer was changed in magnitude to measure the capacitances between the conductors 16 and 18, and between the conductors 16 and 30, at different frequencies of 1, 10 and 100 kHz., and 1, 2 and 50 MHz., with an alternating voltage of 10 millivolts. The result of the measurement indicated that the frequency dependency of the resulting characteristics was not significant. That is, the characteristics followed the curve *b* as shown in FIG. 2. Also, assuming that a maximum capacitance between the conductors 16 and 18 had a value of 1, its minimum value was 0.5.

With similar devices having the width *e* of 10 microns and the spacing *d* of 25 microns, the same characteristics remained substantially unchanged even at higher frequencies up to 100 MHz. Referring now to FIG. 7, there is illustrated an electric circuit equivalent to the arrangement of the conventional design such as shown in FIG. 4. The equivalent circuit includes a capacitance $C_N$ provided by the N-type region 10, and a capacitance $C_p$ developed between the P-type region 22 and the metallic layer 14, with both capacitances connected on one side to the conductor 18. The other sides of the capacitances $C_N$ and $C_p$ are connected across a rectifier RC, formed of the P–N junction 24, and also to the conductors 16 and 30 respectively. The capacitance $C_N$ greatly varies in magnitude in response to the applied voltage while the capacitance $C_p$ varies far less in response to such voltage because the P-type region is formed of a highly doped semiconductive material.

FIG. 8, wherein like reference characters designate the components identical to those illustrated in FIG. 7, shows an electric circuit equivalent to the arrangement as illustrated in FIGS. 5 and 6. It is seen that the capacitor 36 and the control source 34 are connected across the conductors 16 and 18. In other respects the circuit is identical to that illustrated in FIG. 7.

The capacitor 36, shown in FIG. 6 or 8, should have a high capacitance for the following reason: It is assumed that the capacitor 36 has its capacitance less than the capacitance $C_p$. Then, a voltage across the P–N junction is subject to a variation due to a portion of the alternating voltage applied across the P–N junction 22 in a circuit including a parallel combination of a capacitance $C_{pN}$ (not shown in FIG. 8), provided by the P–N junction 24, and the capacitor 36, and having the capacitance $C_p$ serially connected to the parallel combination, and at the particular frequency of alternating current applied to the metallic layer 14. In order to minimize that variation in voltage across the P–N junction 24, it is necessary for the capacitor 36 to have a high capacitance to decrease its impedance.

In the arrangement illustrated in FIGS. 5 and 6, a capacitance between the conductors 16 and 18, or between the substrate 10 and the metallic layer 14 (which is formed mainly of the capacitance $C_N$), varies in response to a control voltage provided between the conductors 16 and 30 by the source 34. That is, the arrangement provides a variable capacitance device including a capacitance terminal and another terminal separated away from it to control the capacitance, for the reasons as will be subsequently described.

It is recalled that with the conductor 16 connected to ground and a negative voltage applied to the conductor 18, the inversion layer is formed on that portion contacting the metallic layer 14 of the N-type region 10. If an increase or a decrease in the number of the majority carriers, in this case the holes in the inversion layer, follows the measurement frequency, then the capacitance of the inversion layer will increase. Those holes are injected into the inversion layer through the P-type region 22 at a rate dependent upon the potential of the P-type region relative to the inversion layer. As the P-type region 24 is more reversely biased, the number of the holes injected from the P-type region 22 into the inversion layer decreases. To inject sufficiently the holes from the P-type region 22 into the inversion layer formed in the N-type region 10, it is required to render the P-type region equal in potential to the inversion layer. Further, if the control voltage across the P- and N-type regions 22 and 10, respectively, is adjusted so as to render both the potentials substantially equal to each other, then the capacitance across the conductors 16 and 18 results in a great variation.

The arrangement as illustrated in FIGS. 5 and 6 has capacitance-to-voltage characteristics such as shown in FIGS. 9 and 10. In FIG. 9, the axis of abscissas represents the voltage in volts applied across the conductors 16 and 18 shown in FIG. 8 or 6, with the conductor 16 connected to ground, and the axis of ordinates represents a ratio between the capacitances between the conductors 16 and 18, the maximum capacitance therebetween being equal to one with the parameter being the voltage in volts across the control source 34. FIG. 10 is different from FIG. 9 only in that in FIG. 10 represents the condition wherein the conductors 30 and 18 have a voltage applied thereacross and a capacitance measured therebetween.

From FIG. 10 it is seen that the arrangement may be readily used by varying the control voltage with zero voltage across the capacitance terminals represented by the conductors 30 and 18. It is noted that the capacitance-to-voltage characteristics as shown in FIGS. 9 and 10 remained substantially unchanged over a frequency range of from 1 kHz. to 50 MHz. while the substrate 10 had its temperature maintained at 300° K.

FIG. 11 shows an arrangement substantially similar to that illustrated in FIGS. 5 and 6 excepting that a plurality of metallic layers or electrodes 16*a*, *b* and *c* are disposed in an electrically isolated relationship on the insulating film 12′ and have the respective conductors 18*a*, *b* and *c* attached thereto. Therefore, like reference numerals designate the components identical or corresponding to those shown in FIG. 6 and their structure need not be further described.

The arrangement of FIG. 11 provides a multiganged MIS-type variable capacitance semiconductor device. If a voltage applied across the P- and N-type regions 22 and 10 by the control source 34 varies, then the respective capacitances between the N-type region 10 and the metallic layers 14*a*, *b* and *c*, or between the conductor 16 and the conductors 18*a*, *b* and *c*, are simultaneously changed in response to the variation in the control voltage. Similarly, the variation in voltage across the control source 34 causes simultaneous changes in respective capacitances between the P-type region 22, or the conductor 30, and the metallic layers 14*a*, *b* and *c*, or the conductors 18*a*, *b* and *c*. Such variations in capacitances will be readily understood from the illustration of FIGS. 9 and 10. With the voltages between the P-type region 22 and the metallic layers 14*a*, *b* and *c* maintained at a zero magnitude, the adjustment of the voltage across the control source 34 permits the capacitances between the same region and layers to be simultaneously changed as in the arrangement shown in FIGS. 5 and 6.

FIG. 12 shows a modification of the arrangement illustrated in FIG. 11 wherein each of plural metallic layers 14*a*, *b* or *c* extends over a different one of groups of teeth 18 forming a single comb for the P-type region 22. For example, the metallic layer 14*b* extends over two intermediate teeth 32 and also over one portion of end teeth 32 wider than the intermediate teeth through a common insulating film 12′ with those teeth forming one group of comb's teeth. In other respects the arrangement is substantially identical to that illustrated in FIG. 11 and like reference numerals and characters have been employed to identify the components corresponding to those illustrated in FIG. 11.

From the foregoing it will be appreciated that the objects of the invention have been accomplished by the provision of MIS-type structures including the semiconductive substrate. The capacitance of such a structure depends upon the thickness, and dielectric constant of the insulating film 12′ and the area of the associated capacitance electrode. Also a range within which the capacitance is variable depends upon the impurity concentration of the substrate 10 and the thickness and dielectric constant of the insulating film 12′.

While the invention has been illustrated and described in conjunction with a few preferred embodiments thereof it is to be understood that various changes and modifications may be resorted to without departing from the spirit and scope of the invention. For example, the selective epitaxial growth or alloying technique may be used to form in a semiconductive substrate of one conductivity type a semiconductive region of opposite conductivity type. Also the insulating film may be deposited upon the substrate through the growth in gaseous phase or vacuum evaporation. Further, if desired, the semiconductive regions may have the conductivity type reversed from that illustrated.

In addition, the epitaxial or diffusion technique or the like may be used to form a highly doped layer on that face remote from the insulating film or the substrate to decrease the thickness of that portion low in impurity concentration of the substrate itself, thereby producing a device effectively operable in the very high-frequency band.

I claim:

1. A MIS-type variable capacitance semiconductor device comprising, in combination, a first region of semiconductive material having one type conductivity and including a pair of substantially flat opposed main faces, a comb-shaped second region of semiconductive material defining a plurality of tooth portions of opposite type conductivity disposed on one of the main faces of said first region to form therebetween a P–N junction terminating at the one main face, a film of electrical insulating material disposed on the one main face of said first region and on all but a predetermined portion of the surface of the second region, thereby leaving the surface of the second region exposed at said predetermined portion, a metallic layer disposed on said insulating film and extending over said P–N junction, and a pair of metallic electrodes attached to the exposed portion of said second region and the other main face of said first region, respectively, whereby an application of a voltage across said first region and said metallic layer forms on the one main face of said first region an inversion layer into which the majority carriers for said inversion layer are injected through said second region.

2. An MIS-type variable capacitance semiconductor device as claimed in claim 1, wherein said metallic layer extends over at least a portion of said plurality of the tooth portions of said second region and is spaced therefrom by said insulating film.

3. An MIS-type variable capacitance semiconductor device as claimed in claim 1 further comprising a voltage source connected across said electrodes on said first and second regions to control the capacitance of the device.

4. An MIS-type variable capacitance semiconductor device as claimed in claim 1, further comprising a voltage source connected across said electrodes on said first and second regions to control the capacitance of the device, and a capacitor connected across said source.

5. An MIS-type variable capacitance semiconductor device as claimed in claim 1 wherein said metallic layer is divided into plural portions electrically isolated from one another and having respective metallic electrodes attached thereto.

6. An MIS-type variable capacitance semiconductor device as claimed in claim 1 wherein said metallic layer is divided into plural portions electrically isolated from one another and having respective metallic electrodes attached thereto, and further comprising electric control source means connected across said pair of electrodes on said first and second regions for effecting simultaneous changes in capacitances between a selected one of said first and second regions and said plural portions of said metallic layer.

7. An MIS-type variable capacitance semiconductor device as claimed in claim 1, wherein said metallic layer is divided into plural portions electrically isolated from one another and extending over different groups of teeth of said comb-shaped second region, and further comprising additional metallic electrodes attached to said plural portions respectively of said metallic layer.

8. An MIS-type variable capacitance semiconductor device comprising, in combination, a first region of semiconductive material having one type conductivity and including a pair of substantially flat opposed main faces, a comb-shaped second region of semiconductive material defining a plurality of tooth portions of opposite type conductivity disposed within said first region to form therebetween a P–N junction, said second portion having opposed first and second main faces, with said first main face terminating at one of said main faces of said first region, a film of electrical insulating material disposed on said one main face of said first region and on all but a predetermined portion of said first main face of said second region, thereby leaving said first main face of the second region exposed at said predetermined portion, a metallic layer disposed on said insulating film and extending over said P–N junction, first and second metallic electrodes attached to the exposed portion of said second region and the other main face of said first region, respectively, and a third metallic electrode attached to said metallic layer.